US009713294B2

(12) United States Patent
Kim et al.

(10) Patent No.: US 9,713,294 B2
(45) Date of Patent: Jul. 18, 2017

(54) DISPLAY APPARATUS INCLUDING HEAT-RADIATING SHEET

(71) Applicant: Samsung Display Co., Ltd., Yongin (KR)

(72) Inventors: Hwanjin Kim, Yongin (KR); Minki Kim, Yongin (KR); Yunho Kim, Yongin (KR); Kangyong Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 2 days.

(21) Appl. No.: 14/716,753

(22) Filed: May 19, 2015

(65) Prior Publication Data
US 2016/0100508 A1    Apr. 7, 2016

(30) Foreign Application Priority Data

Oct. 7, 2014    (KR) .................. 10-2014-0135118

(51) Int. Cl.
*H05K 7/20*    (2006.01)
(52) U.S. Cl.
CPC ..... *H05K 7/20963* (2013.01); *H05K 7/20472* (2013.01)
(58) Field of Classification Search
CPC ....... H05K 7/20954–7/20963; H05K 7/20472; F21V 29/00; F21V 23/00; H01J 7/28; H01J 2229/0092
USPC .................. 361/679.46–679.54, 688–723
See application file for complete search history.

(56) References Cited

U.S. PATENT DOCUMENTS

| | | | |
|---|---|---|---|
| 6,265,820 B1 | 7/2001 | Ghosh et al. | |
| 7,315,451 B2 * | 1/2008 | Kim | H05K 7/20963 313/46 |
| 8,218,325 B2 * | 7/2012 | Song | H05K 1/0203 361/752 |
| 9,226,432 B2 * | 12/2015 | Yamakita | G09F 9/00 |
| 2005/0117293 A1 | 6/2005 | Yokoyama | |
| 2006/0291153 A1 * | 12/2006 | Bae | G06F 1/1601 361/679.22 |
| 2007/0159078 A1 | 7/2007 | Park et al. | |
| 2007/0247053 A1 * | 10/2007 | Yoo | H01J 17/18 313/489 |
| 2008/0131756 A1 | 6/2008 | Krassowski et al. | |
| 2010/0156763 A1 | 6/2010 | Lee et al. | |
| 2012/0112616 A1 * | 5/2012 | Kim | H05K 7/20963 313/46 |

(Continued)

FOREIGN PATENT DOCUMENTS

| | | |
|---|---|---|
| KR | 10-2005-0036719 | 4/2005 |
| KR | 10-2007-0067909 | 6/2007 |
| KR | 10-2010-0072653 | 7/2010 |

*Primary Examiner* — Zachary M Pape
(74) *Attorney, Agent, or Firm* — H.C. Park & Associates, PLC

(57) ABSTRACT

A display apparatus includes a display panel, and a heat-radiating sheet located on a non-display surface of the display panel, wherein the heat-radiating sheet includes a first heat-radiating sheet in a central portion of the display panel, and a second heat-radiating sheet in edge portions of the display panel, and locations (heights) of the first heat-radiating sheet and the second heat-radiating sheet in a vertical direction are different from each other.

16 Claims, 5 Drawing Sheets

(56) References Cited

U.S. PATENT DOCUMENTS

2014/0247620 A1* 9/2014 Sasaoka .............. G02B 6/0085
362/611

* cited by examiner

DISPLAY APPARATUS INCLUDING HEAT-RADIATING SHEET

CROSS-REFERENCE TO RELATED APPLICATION

This application claims priority from and the benefit of Korean Patent Application No. 10-2014-0135118, filed on Oct. 7, 2014, which is hereby incorporated by reference for all purposes as if fully set forth herein.

BACKGROUND

Field

Exemplary embodiments relate to a display apparatus.

Discussion of the Background

As information technology develops, the market for display apparatuses, which are media for connecting users and information, is expanding. Thus, the use of flat panel display (FPD) apparatuses such as liquid crystal display (LCD) apparatuses, organic light-emitting diode (OLED) display apparatuses, and plasma display panels (PDPs) is increasing.

In an organic light-emitting display apparatus of an FPD apparatus, a self-emitting device that emits light itself when electric current flows in an organic emission layer located between two electrodes is used. The device emits light when excitons which are combinations of injected electrons and holes fall from an excited state to a ground state.

Such organic light-emitting display apparatuses have faster response times than LCD apparatuses and have flexibility. Thus, organic light-emitting display apparatuses are becoming more widely used, for example, in the field of home appliances such as televisions (TVs) or videos, and in industrial fields such as computers including notebook computers or cell phones.

Accordingly, in order to apply organic light-emitting display apparatuses to various fields, solutions for a heat radiation problem occurring in display panels when the organic light-emitting display apparatuses are driven are required.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display apparatus.

Additional aspects will be set forth in the detailed description which follows, and, in part, will be apparent from the disclosure, or may be learned by practice of the inventive concept.

According to exemplary embodiments, a display apparatus includes a display panel, and a heat-radiating sheet located on a non-display surface of the display panel, wherein the heat-radiating sheet comprises a first heat-radiating sheet in a central portion of the display panel and a second heat-radiating sheet in edge portions of the display panel, and locations (heights) of the first heat-radiating sheet and the second heat-radiating sheet in a vertical direction are different from each other.

The apparatus may further include an insulator for inhibiting heat conduction, being located between the first heat-radiating sheet and the display panel.

The apparatus may further include an insulator for inhibiting heat conduction, being located on an opposite side of the display panel with respect to the second heat-radiating sheet.

The insulator may be formed of a material capable of absorbing external shocks.

The heat-radiating sheet may be formed of one selected from the group of graphite and copper.

The apparatus may further include an insulator located on the non-display surface of the display panel and inhibiting heat conduction, wherein the insulator may be located between the first heat-radiating sheet and the display panel, and located on an opposite side of the display panel with respect to the second heat-radiating sheet respectively.

The first heat-radiating sheet may include two-sheet layers.

According to exemplary embodiments, a display apparatus includes a display panel, a heat-radiating sheet located on a non-display surface of the display panel, and an insulator located on the non-display surface of the display panel and inhibiting heat conduction, wherein a stack-sequence of the heat-radiating sheet and the insulator in a central portion of the display panel is the opposite of a stack-sequence of the heat-radiating sheet and the insulator in edge portions of the display panel.

The insulator may be located between the display panel and the heat-radiating sheet, in the central portion.

The display panel, the heat-radiating sheet, and the insulator may be sequentially stacked in the edge portions.

The insulator may be formed of a material capable of absorbing external shocks.

The heat-radiating sheet may be formed of one selected from the group of graphite and copper.

According to exemplary embodiments, a display apparatus comprises a display panel; a heat generating source located on an opposite side of the display panel; and a heat-radiating sheet located on a non-display surface of the display panel; wherein the heat-radiating sheet comprises: a first heat-radiating sheet formed closer to the heat generating source; and a second heat-radiating sheet formed closer to the display panel.

The apparatus may further include an insulator for inhibiting heat conduction, being located between the first heat-radiating sheet and the display panel.

The apparatus may further include an insulator for inhibiting heat conduction, being located on an opposite side of the display panel with respect to the second heat-radiating sheet.

The insulator may be formed of a material capable of absorbing external shocks.

The heat-radiating sheet may be formed of one selected from the group of graphite and copper.

The apparatus may further include an insulator located on the non-display surface of the display panel and inhibiting heat conduction, wherein the insulator may be located between the first heat-radiating sheet and the display panel, and located on an opposite side of the display panel with respect to the second heat-radiating sheet respectively.

The first heat-radiating sheet may include two-sheet layers.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
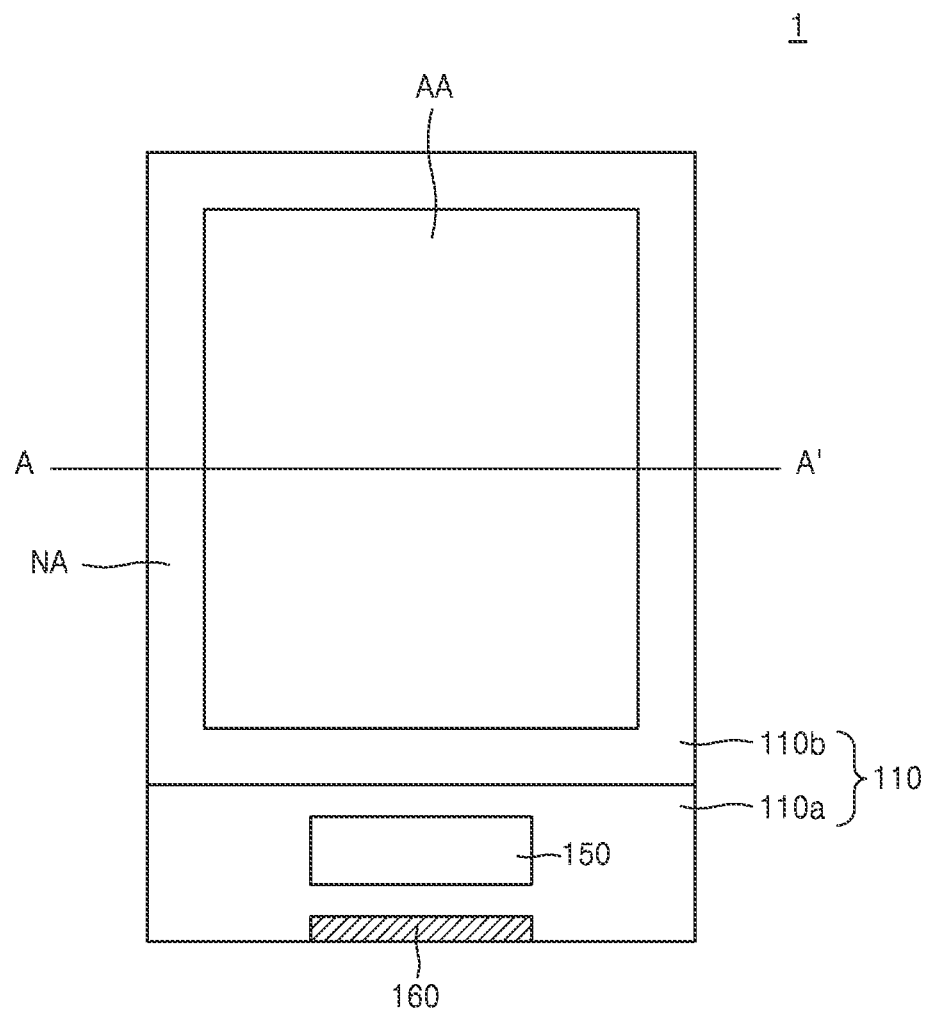
FIG. 1 is a plan view of a display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
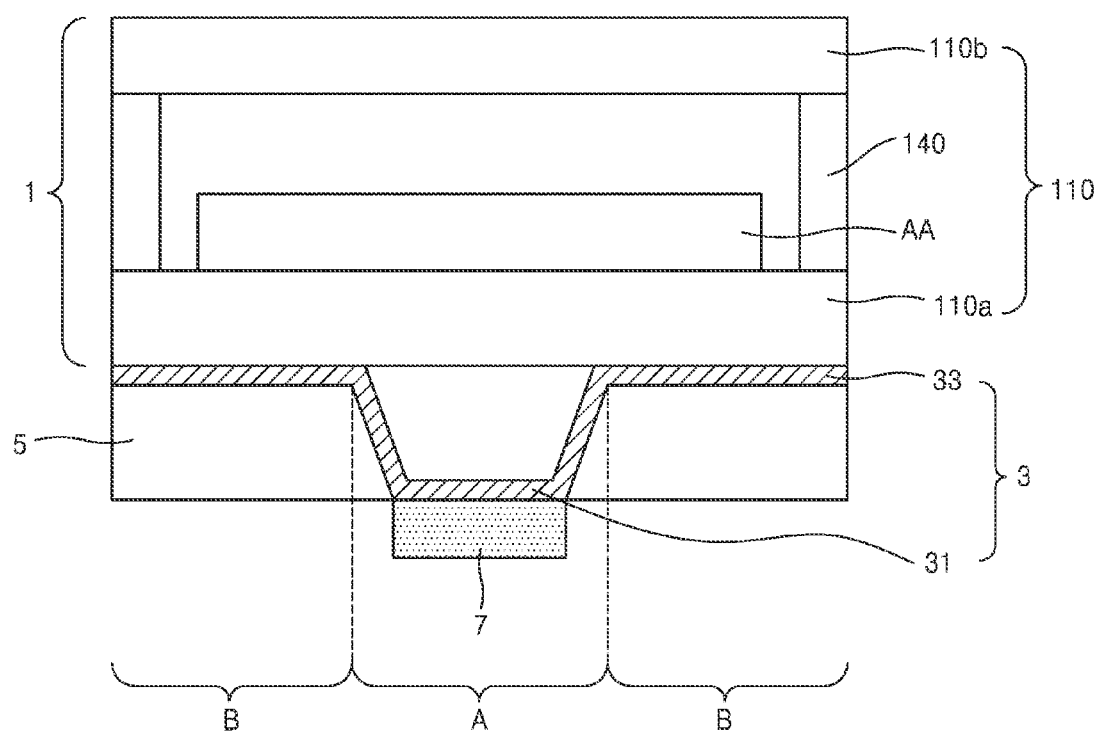
FIG. 2 is a cross-sectional view taken along a line A-A' of FIG. 1.
Figure 3:
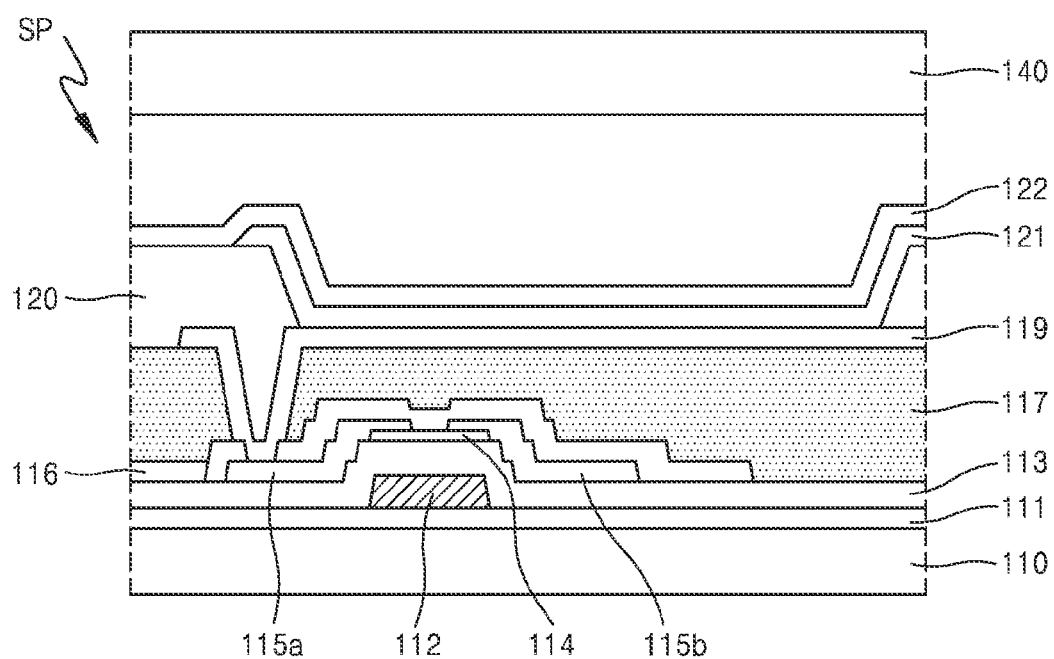
FIG. 3 is a schematic view of a cross-section of sub-pixels shown in FIG. 1, according to an exemplary embodiment.
Figure 4:
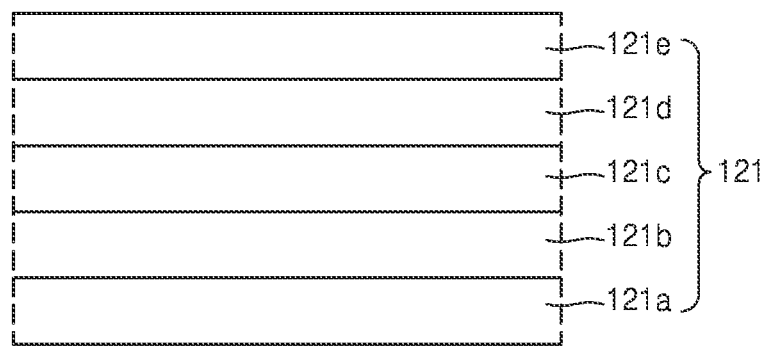
FIG. 4 is a schematic view of several layers of an organic emission layer.

FIG. 1 is a plan view of a display apparatus according to an exemplary embodiment, and FIG. 2 is a cross-sectional view taken along a line A-A' of FIG. 1. FIG. 3 is a schematic view of a cross-section of sub-pixels SP, according to an exemplary embodiment. FIG. 4 is a schematic view of several layers of an organic emission layer.

The display apparatus according to the present exemplary embodiment may include a display panel 1 and a heat-radiating sheet 3.

Referring to FIGS. 1, 2, 3 and 4, the display panel 1 may include a substrate 110a on which a display area AA is defined by sub-pixels SP formed in a matrix shape, and a sealing substrate 110b which protects the sub-pixels SP formed on the substrate 110a from moisture or oxygen.

Regarding the sub-pixels SP, an organic light-emitting diode (OLED) of a passive matrix type or an active matrix type may be a top-emission type such that the OLED emits light in a direction to the sealing substrate 110b. In the case that the sub-pixels SP are formed in an active matrix shape, the sub-pixels SP may have a two-transistor and one-capacitor (2T1C) structure including a switching transistor, a driving transistor, a capacitor, and an OLED or may have a structure in which more transistors and capacitors are added thereto. Hereinafter, a structure of the sub-pixels SP is described in detail.

As shown in FIG. 3, a buffer layer 111 is laid on the substrate 110a. The buffer layer 111 may be formed to protect a thin film transistor (TFT) formed in a subsequent process from impurities such as alkali ions discharged from the substrate 110a.

A silicon oxide (SiOx), a silicon nitride (SiNx), and the like may be used for the buffer layer 111. A gate electrode 112 is located on the buffer layer 111.

The gate electrode 112 may be formed of one selected from the group consisting of molybdenum (Mo), aluminum (Al), chromium (Cr), gold (Au), titanium (Ti), nickel (Ni), neodymium (Nd) and copper (Cu) or an alloy of any elements thereof as a single layer or a multiple layer.

A first insulating film 113 is located on the gate electrode 112. The first insulating film 113 may be a SiOx film, a SiNx film, or multiple layers of them; however, the first insulating film 113 is not limited thereto.

An active layer 114 is located on the first insulating film 113. The active layer 114 may include amorphous silicon, or polycrystalline silicon formed by crystallizing the amorphous silicon. Although not illustrated, the active layer 114 may include a channel region, a source region, and a drain region. The source region and the drain region may be doped with P-type or N-type impurities. Also, the active layer 114 may include an ohmic contact layer to lower contact resistance.

A source electrode 115a and a drain electrode 115b are located on the active layer 114. The source electrode 115a and the drain electrode 115b may be formed as a single layer or a multiple layer. In the case that the source electrode 115a and the drain electrode 115b are formed as a single layer, the source electrode 115a and the drain electrode 115b may be formed of one selected from the group consisting of Mo, Al, Cr, Au, Ti, Ni, Nd, and Cu or an alloy of any elements thereof. On the other hand, in the case that the source electrode 115a and the drain electrode 115b are formed as a multiple layer, the source electrode 115a and the drain electrode 115b may be formed as a dual layer of Mo/Al—Nd, or as a triple layer of Mo/Al/Mo or Mo/Al-Nd/Mo.

A second insulating film 116 is located on the source electrode 115a and the drain electrode 115b. The second insulating film 116 may be a SiOx film, a SiNx film, or a multiple layer thereof however, the second insulating film 116 is not limited thereto. The second insulating film 116 may be a passivation film.

A third insulating film 117 is located on the second insulating film 116. The third insulating film 117 may be a SiOx film, a SiNx film, or a multiple layer thereof however, the third insulating film 117 is not limited thereto. The third insulating film 117 may be a planarization film.

The above description relates to a bottom gate type driving transistor located on the substrate 110a. Hereinafter, an OLED located on the driving transistor will be described.

A first electrode 119 is located on the third insulating film 117. The first electrode 119 may be selected as an anode or a cathode. As first electrode 119 selected as an anode, a transparent material such as indium tin oxide (ITO) or indium zinc oxide (IZO) may be used; however, the first electrode 119 is not limited thereto.

A bank layer 120 with an opening portion exposing a portion of the first electrode 119 is located on the first electrode 119. The bank layer 120 may include an organic material such as benzocyclobutene (BCB) resin, polyacrylates resin, or polyimides resin; however, the bank layer 120 is not limited thereto.

An organic emission layer 121 is located in the opening portion of the bank layer 120. As shown in FIG. 4, the organic emission layer 121 includes a hole injection layer 121a, a hole transport layer 121b, an emission layer 121c, an electron transport layer 121d, and an electron injection layer 121e.

The hole injection layer 121a may facilitate injection of holes. Although the hole injection layer 121a may be formed of one or more selected from the group consisting of copper phthalocyanine (CuPc), poly(3,4-ethylenedioxythiophene) (PEDOT), polyaniline (PANI), and N,N-dinaphthyl-N,N'-diphenyl benzidine (NPD), the hole injection layer 121a is not limited thereto.

The hole transport layer 121b may facilitate transport of holes. Although the hole transport layer 121b may be formed of one or more selected from the group consisting of NPD (or NPB), N,N'-bis-(3-methylphenyl)-N,N'-bis-(phenyl)-benzidine (TPD), 2,2',7,7'-tetrakis-(N,N-diphenylamino)-9,9'-spirobifluorene (Spiro-TAD), and 4,4',4''-Tris(N-3-methylphenyl-N-phenyl-amino)-triphenylamine (MTDATA), the hole transport layer 121b is not limited thereto.

The emission layer 121c includes a host and a dopant. The emission layer 121c may include a material emitting red, green, blue, or white light and may be formed by using a phosphorescent or fluorescent material. In the case that the emission layer 121c emits red light, the emission layer 121c may be formed of a phosphorescent material including a host material which includes carbazole biphenyl (CBP) or 1,3-bis(carbazol-9-yl)benzene (mCP) and including a dopant material which includes one or more selected from the group consisting of bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP). Alternatively, the emission layer 121c may be formed of a fluorescent material including PBD:Eu(DBM)3(Phen) or perylene; however, the emission layer 121c is not limited thereto. In the case that the emission layer 121c emits green light, the emission layer 121c may be formed of a phosphorescent material including a host material which includes CBP or mCP and including a dopant material which includes fac-tris(2-phenylpyridine)iridium (Ir(ppy)3). Alternatively, the emission layer 121c may be formed of a fluorescent material including tris(8-hydroxyquinolino)aluminum (Alq3); however, the emission layer 121c is not limited thereto. In the case that the emission layer 121c emits blue light, the emission layer 121c may be formed of a phosphorescent material including a host material which includes CBP or mCP and including a dopant material which includes (4,6-F2ppy)2Irpic. Alternatively, the emission layer 121c may be formed of a fluorescent material including one selected from the group consisting of 2,2',7,7'-tetrakis(2,2-diphenylvinyl) spiro-9,9'-bifluorene (spiro-DPVBi), spiro-sixphenyl (spiro-6P), distyrylbenzene (DSB), distyrylarylene (DSA), polyfluorene (PFO)-based polymer, and poly(p-phenylene vinylene) (PPV)-based polymer; however, the emission layer 121c is not limited thereto.

The electron transport layer 121d may facilitate transport of electrons. Although the electron transport layer 121d may be formed of one or more selected from the group consisting of Alq3, 2-biphenyl-4-yl-5-(4-t-butylphenyl)-1,3,4-oxadiazole (PBD), 3-phenyl-4-(1'-naphthyl)-5-phenyl-1,2,4-triazole (TAZ), spiro-PBD, bis(2-methyl-8-quinolinolato)(p-phenylphenolato)aluminum (BAlq), and aluminum(III)bis(2-methyl-8-quinolinolato)triphenylsilanolate (SAlq), the electron transport layer 121d is not limited thereto.

The electron injection layer 121e may facilitate injection of electrons. Although Alq3, PBD, TAZ, lithium fluoride (LiF), Spiro-PBD, BAlq, or SAlq may be used for the electron injection layer 121e, the electron injection layer 121e is not limited thereto. Exemplary embodiments are not limited to FIG. 4, and at least one of the hole injection layer 121a, the hole transport layer 121b, the electron transport layer 121d, and the electron injection layer 121e may be omitted.

A second electrode 122 is located on the organic emission layer 121. The second electrode 122 may be selected as a cathode or an anode. As a material of the second electrode 122 selected as a cathode, Al or the like may be used; however, the second electrode 122 is not limited thereto.

The substrate 110a and the sealing substrate 110b which form a display panel 110 are attached and sealed by an adhesive member 140 formed in a non-display area NA (FIG. 1) located around the display area AA. However, the sealing substrate 110b may be sealed by a multi-protective film formed of an organic material, an inorganic material, or a compound of organic and inorganic materials. For example, the organic material may be polymers and the inorganic material may be metallic oxide, metallic nitride or ceramics. However, these materials are not limited thereto. Meanwhile, the illustrated organic light-emitting display apparatus may have a pad portion 160 provided at a perimeter of the substrate 110a to receive various signals or power supplies from the outside and may have devices which are formed on the substrate 110a driven by a driving unit 150 including one chip. Although it is illustrated that the driving unit 150 includes a data driving portion and a scan driving portion, the scan driving portion may be separately formed in the non-display area NA (FIG. 1).

The display apparatus according to the present exemplary embodiment may include the heat-radiating sheet 3 formed on a non-display surface of the display panel 1.

As shown in FIG. 2, a heat generating source 7 by which heat is generated in the display apparatus may be formed in a central portion A of the display panel 1. However, there may be various causes of heat generated in the display apparatus, and a position at which heat is generated in the display apparatus is not limited thereto.

As shown in FIG. 2, the heat-radiating sheet 3 may include a first heat-radiating sheet 31 in the central portion A of the display panel 1 and a second heat-radiating sheet 33 in edge portions B of the display panel 1.

Also, as shown in FIG. 2, vertical heights of the first heat-radiating sheet 31 and the second heat-radiating sheet 33 may be different.

The heat generated in the display apparatus radiates through a display surface. In the case that all the vertical heights of the first heat-radiating sheet 31 and the second heat-radiating sheet 33 are level, the heat is concentrated on the central portion A of the display apparatus to radiate while the heat radiation in the edge portions B is low, therefore, a prior art using the heat-radiating sheet having no difference in the vertical heights may cause a problem such as a user suffering from low-temperature burns. Regarding the edge portions B of the display surface, it takes time for the heat spreading over both edges of the display surface to radiate through the display surface since the heat generated in the heat generating source 7 of the central portion A is conducted through the edge portions B via the heat-radiating sheet 3.

On the other hand, in the case of the central portion A of the display surface, the heat generated in the heat generating source 7 of the central portion A radiates through the central portion A of the display surface while being conducted to the edge portions B via the heat-radiating sheet 3.

Accordingly, there is a problem that a proportion of heat radiating through the display surface is low in the edge portions B and concentrated in the central portion A. In this case, the temperature rises excessively only in the central portion A of the display surface, and thus problems the low-temperature burns mentioned above may occur.

The display apparatus according to the present exemplary embodiment may have the heat-radiating sheet 3 separated into the first heat-radiating sheet 31 and the second heat-radiating sheet 33 according to the location of the display surface.

In particular, as shown in FIG. 2, locations (heights) of the first heat-radiating sheet 31 and the second heat-radiating sheet 33 in a vertical direction may be different.

That is, the first heat-radiating sheet 31 located in the central portion A of the display panel 1 may be formed closer to the heat generating source 7. On the other hand, the second heat-radiating sheet 33 located in the edge portions B may be formed closer to the display panel 1.

As the second heat-radiating sheet 33 in a vertical direction is located far from the heat generating source 7 and close to the display panel 1, the amount of heat-dissipation through the display panel 1 may increase.

That is, as the second heat-radiating sheet 33 and the display panel 1 are close to each other, the time taken to conduct heat from the second heat-radiating sheet 33 to the display surface decreases, thereby increasing an amount of heat conducted from the edge portions B.

Thus, an amount of heat conducted from the first heat-radiating sheet 31 to the second heat-radiating sheet 33 may increase, and a proportion of heat-radiating through the central portion A of the display surface may decrease.

Accordingly, in the display apparatus according to the present exemplary embodiment, locations (heights) of the first heat-radiating sheet 31 and the second heat-radiating sheet 33 in a vertical direction may be different from each other. As the second heat-radiating sheet 33 is close to the display surface, the amount of heat-dissipation from the second heat-radiating sheet 33 may increase. Consequently, the amount of heat conducted from the first heat-radiating sheet 31 to the second heat-radiating sheet 33 increases, and the proportion of heat-radiating through the central portion A of the display surface decreases, and a proportion of heat-radiating through the edge portions B increases.

Thus, as a proportion of heat-radiating from the central portion A and the edge portions B of the display surface is not concentrated in the central portion A but is evenly distributed, which may prevent problems such as low-temperature burns.

As shown in FIG. 2, the display apparatus according to the present exemplary embodiment may further include an insulator 5 for inhibiting heat conduction.

While the heat-radiating sheet 3 serves to conduct heat such that the heat is not concentrated on a portion but is evenly distributed, the insulator 5 may serve to block the heat.

That is, the insulator 5 absorbs a certain amount of heat so as to prevent a large amount of heat from entirely radiating when heat radiates toward the display surface of the display panel 1. The insulator 5 may be made of a foamed-material in which a lot of air space is formed, for example, polystyrene; however, the insulator 5 is not limited thereto. Materials such as acrylic, polypropylene or polyurethane may be used as the insulator 5.

Since, in the display apparatus according to the present exemplary embodiment, the locations (heights) of the first heat-radiating sheet 31 and the second heat-radiating sheet 33 in a vertical direction may be different from each other, locations (heights) of the insulator 5 in a vertical direction respectively in the central portion A and the edge portions B may also be different from each other.

In the central portion A, the insulator 5 may be located between the first heat-radiating sheet 31 and the display panel 1. Thus, it takes time for heat to be conducted from the heat generating source 7 to the display panel 1 through the first heat-radiating sheet 31 and the insulator 5, and it is difficult to radiate a large amount of heat at one time in the central portion A.

On the other hand, in the edge portions B, the insulator 5 may be on an opposite side of the display panel 1 with respect to the second heat-radiating sheet 33.

That is, as the heat conducted to the second heat-radiating sheet 33 from the first heat-radiating sheet 31 is directly conducted to the display panel 1 without passing through the insulator 5, an amount of heat radiated from the edge portions B may increase.

As shown in FIG. 2, the insulator 5 may be formed both in the central portion A and the edge portions B; however, the insulator 5 is not limited thereto. If the insulator 5 is intended for insulation, the insulator 5 may be formed only in the central portion A or may be formed only in the edge portions B.

Also, the insulator 5 may be formed by using a material capable of absorbing external shock.

The insulator 5 not only may absorb the heat for insulation but also may absorb shocks, such as when the display apparatus is subjected to a shock from the outside, in order to protect the display apparatus from being damaged.

The heat-radiating sheet 3 included in the display apparatus according to the present exemplary embodiment may be formed of graphite or copper.

Graphite and copper have a high heat conductivity compared to other materials. Accordingly, in the case where graphite or copper is used in the heat-radiating sheet 3, heat may be conducted efficiently. However, materials of the heat-radiating sheet 3 are not limited thereto, and any material having heat conductivity may be used.

Figure 5:
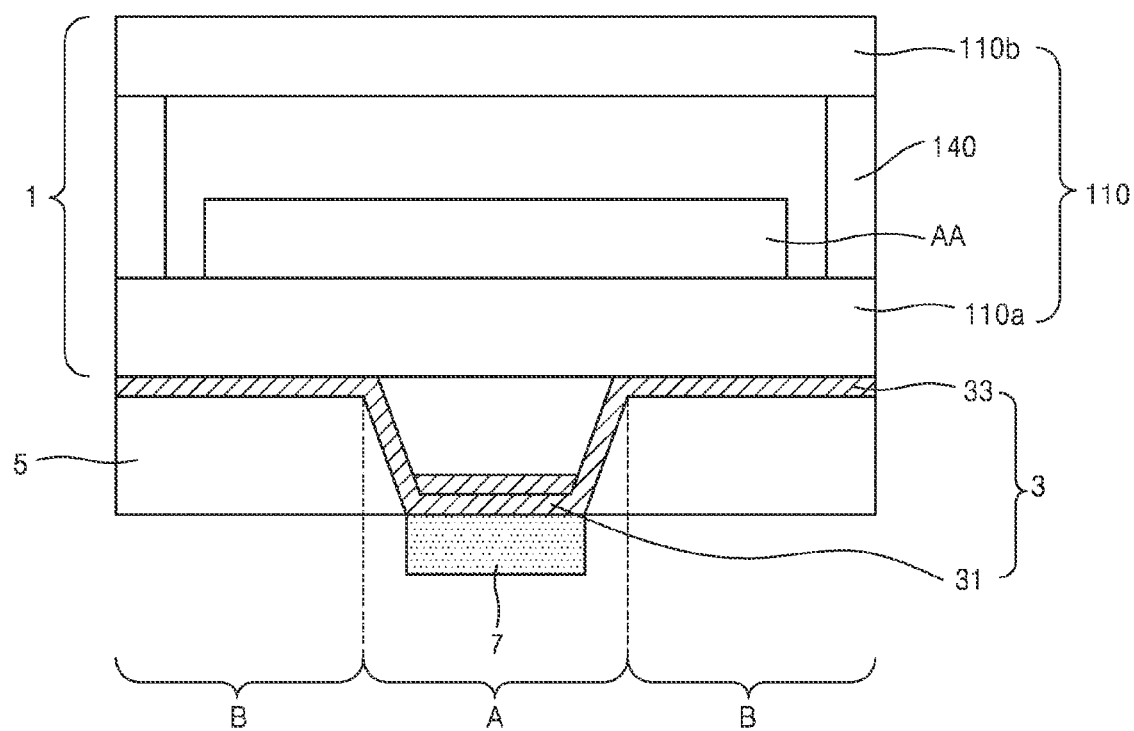
FIG. 5 is a schematic view of a display apparatus according to another exemplary embodiment.

FIG. 5 is a schematic view of a display apparatus according to another exemplary embodiment.

The display apparatus according to the present exemplary embodiment may include the heat-radiating sheet 3, and the first heat-radiating sheet 31 located in the central portion A may include two-sheet layers.

As the first heat-radiating sheet 31 includes two-sheet layers, an amount of heat conducted to the second heat-radiating sheet 33 may increase compared to when the first heat-radiating sheet 31 includes one-sheet layer.

Thus, an amount of heat radiated from the edge portions B may increase, and an amount of heat radiated from the central portion A may decrease, and heat may be uniformly radiated from the central portion A and the edge portions B because the two-sheet layers are beneficial in conducting the heat to the second heat-radiating sheet 33.

As described above, according to one or more of the above exemplary embodiments, heat radiated through a display surface of a display apparatus may spread uniformly over the entire display surface.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display apparatus, comprising:
a display panel;
an insulator; and
a heat-radiating sheet located on a non-display surface of the display panel,
wherein the heat-radiating sheet comprises a first heat-radiating sheet on a central portion of the display panel, and a second heat-radiating sheet on edge portions of the display panel, and
wherein the insulator comprises a first insulator located between the first heat-radiating sheet and the display panel and a second insulator covering the second heat-radiating sheet, and
wherein the second heat-radiating sheet is located between the display panel and the second insulator.

2. The display apparatus of claim 1, wherein the insulator is formed of a material capable of absorbing external shocks.

3. The display apparatus of claim 1, wherein the second insulator is located on the non-display surface of the display panel.

4. The display apparatus of claim 1, wherein the heat-radiating sheet is a single continuous structure.

5. A display apparatus, comprising:
a display panel;
a heat-radiating sheet located on a non-display surface of the display panel; and
an insulator located on the non-display surface of the display panel,
wherein a stack-sequence of the heat-radiating sheet and the insulator on a central portion of the display panel is the opposite of a stack-sequence of the heat-radiating sheet and the insulator on edge portions of the display panel.

6. The display apparatus of claim 5, wherein the insulator is located between the display panel and the heat-radiating sheet, on the central portion of the display panel.

7. The display apparatus of claim 5, wherein at least one of the edge portions of the display panel, the heat-radiating sheet, and the insulator are sequentially stacked.

8. The display apparatus of claim 5, wherein the insulator is formed of a material capable of absorbing external shocks.

9. The display apparatus of claim 5, wherein the heat-radiating sheet is formed of one selected from the group of graphite and copper.

10. A display apparatus, comprising:
a display panel;
a heat generating source located on a non-display surface of the display panel;
a heat-radiating sheet located on the non-display surface of the display panel, the heat-radiating sheet comprises:

a first heat-radiating sheet spaced apart from the display panel; and a second heat-radiating sheet extending from the first heat-radiating sheet; and a thermal insulator, comprising a foamed material, located between the first heat radiating sheet and the display panel, wherein the first heat-radiating sheet is located closer to the heat generating source than the second heat-radiating sheet, and a portion of the first heat-radiating sheet does not overlap the second heat-radiating sheet.

11. The display apparatus of claim 10, further comprising:

wherein the second heat-radiating sheet is located closer to the display panel than the first radiating sheet.

12. The display apparatus of claim 11, wherein the thermal insulator is formed of a material capable of absorbing external shocks.

13. The display apparatus of claim 10, wherein the second heat-radiating sheet is located between the display panel and the thermal insulator.

14. The display apparatus of claim 10, further comprising:

a second thermal insulator located on the non-display surface of the display panel, wherein the second heat-radiating sheet is located between the display panel and the second thermal insulator.

15. A display apparatus, comprising:

a display panel;

a first heat-radiating sheet located on a non-display surface of the display panel and spaced apart from the display panel;

a second heat-radiating sheet located directly on the non-display surface of the display panel, the second heat-radiating sheet directly contacting the first heat-radiating sheet and extending from the first heat-radiating sheet; and a thermal insulator, comprising a foamed material, located between the first heat radiating sheet and the display panel.

16. The display apparatus of claim 15, wherein the first heat-radiating sheet and the second heat radiating sheet are a single continuous structure.

\* \* \* \* \*